United States Patent … US 7,180,077 B1
Farhoomand … (45) Date of Patent: Feb. 20, 2007

(54) FAR INFRARED PHOTOCONDUCTOR ARRAY

(75) Inventor: Jam Farhoomand, Palo Alto, CA (US)

(73) Assignee: Techoscience Corporation, Palo Atlo, CA (US)

( * ) Notice: Subject to any disclaimer, the term of this patent is extended or adjusted under 35 U.S.C. 154(b) by 73 days.

(21) Appl. No.: 11/062,178

(22) Filed: Feb. 18, 2005

Related U.S. Application Data

(60) Provisional application No. 60/546,700, filed on Feb. 20, 2004.

(51) Int. Cl.
    G01T 1/18 (2006.01)
(52) U.S. Cl. .................................. 250/384.4
(58) Field of Classification Search ............. 250/384.4
    See application file for complete search history.

(56) References Cited

U.S. PATENT DOCUMENTS

| | | | |
|---|---|---|---|
| 4,104,674 A * | 8/1978 | Lorenze et al. | 257/188 |
| 5,095,216 A * | 3/1992 | Walsh | 250/338.4 |
| 5,264,699 A * | 11/1993 | Barton et al. | 250/338.4 |
| 5,365,088 A * | 11/1994 | Myrosznyk | 257/186 |
| 5,512,750 A * | 4/1996 | Yanka et al. | 250/338.4 |
| 5,696,377 A * | 12/1997 | Kanzaki | 250/338.4 |
| 5,751,049 A * | 5/1998 | Goodwin | 257/440 |
| 5,904,495 A * | 5/1999 | Burke et al. | 438/98 |

OTHER PUBLICATIONS

Amato, M.J. et al., "Engineering Concept And Enabling Technologies For A Large Single Aperture Far-Infrared Observatory (SAFIR)," Proceedings Of SPIE, 2003, pp. 1120-1131, vol. 4850.

Bandaru, J. et al., "Far-Infrared Absorption In Sb-doped Ge Epilayers Near The Metal-Insulator Transition," Applied Physics Letters, May 13, 2002, pp. 3536-3538, vol. 80, No. 19.

Bandaru, J. et al., "Growth And Performance Of Ge:Sb Blocked Impurity Band (BIB) Detectors," Proceedings Of SPIE, 2002, oo, 193-199, vol. 4486.

Beeman, J.W. et al., "Extrinsic Germanium Photoconductors For Far-Ir Astronomy: Research Results And Works In Progress," 4 pages.

Beeman, J.W. et al., "High Performance Antimony-Doped Germanium Photoconductors," Infrared Physics & Technology, 1996, pp. 715-721, vol. 37.

Benford, D. J. et al., "Design And Fabrication Of Two-Dimensional Superconducting Bolometer Arrays," Proceedings Of The SPIE, 2004, pp. 647-658, vol. 5498.

Dotson, J. et al., "A 16×24 Germanium Photoconductor Array For AIRES," Proc. Of SPIE, Apr. 2000, pp. 134-144, vol. 4014.

(Continued)

*Primary Examiner*—David Porta
*Assistant Examiner*—Marcus Taningc
(74) *Attorney, Agent, or Firm*—Fenwick & West LLP

(57) ABSTRACT

Fabrication of far infrared photoconductor arrays, especially for low background astronomy, is particularly challenging due to arrays' relatively large pixel size, susceptibility to stray radiation, and the requirement for low bias levels. A hybrid-far infrared photoconductor array as presented, provides a system and method for the development of large-format far IR arrays. The hybrid-far infrared array is provided with a blocking layer, situated in between a detecting layer and a readout layer, which allows detection of far infrared signals without complications based on readout glow. In particular, the readout glow, detector heating, and thermal mismatch between the readout and the detecting layer are addressed by careful selection of the materials for the blocking layer. The blocking layer is provided with an array of conductive vias passing through the bulk of the blocking layer in order to efficiently transmit electrical signals between the detecting layer and the readout layer.

28 Claims, 3 Drawing Sheets

OTHER PUBLICATIONS

Erickson, E.F. et al., "Specification And Design Of The SBRC 190: A Cryogenic Multiplexer For Far-Infrared Photoconductor Detectors," Proceedings Of The SPIE, 2003, pp. 136-143, vol. 4857.

Farhoomand, J. et al., "Characterization Of High Purity GaAs Far-Infrared Photoconductors," Int. J. IR & MM Waves, 1995, 13 pages, pp. vol. 16.

Farhoomand, J. et al., "Characterization Of SBRC-190: A Multi-Gain, Cryogenic Readout Multiplexer For IR Detector Arrays," Proceedings Of SPIE, 2003, pp. 144-154, vol. 4587.

Farhoomand, J. et al., "Microwave-Assisted Far-Infrared Photoconductivity In High Purity GaAs," Proc. SPIE, 2003, 7 pages, vol. 5152.

Farhoomand, J. et al., "A Prototype 1×32 Ge: Ga/Ge:Sb Detector Array With SBRC-190 CTIA Readout Multiplexer," Proc. SPIE, 2002, 10 pages, vol. 4818.

Fujiwara, M. et al., "Development Of A Gallium-Doped Germanium Far-Infrared Photoconductor Direct Hybrid Two-Dimensional Array," Applied Optics, Apr. 20, 2003, pp. 2168-2173, vol. 42, No. 12.

Harvey, P.M. et al., "Single Aperture Far-Infrared Observatory (SAFIR)," Proceedings Of SPIE, 2003, pp. 1097-1108, vol. 4850.

Katterloher, R. et al., "Liquid Phase Epitaxy Centrifuge For Growth Of Ultra-Pure Gallium Arsenide For Far Infrared Photoconductors," Proceedings Of SPIE, 2002, pp. 200-208, vol. 4486.

Matsumoto, T., "Large Aperture Cooled Telescope Mission: SPICA," Proceedings Of SPIE, 2003, pp. 1091-1096, vol. 4850.

Merken, P. et al., "A Low Noise, Low Power Readout Electronics Circuit At 4 K In Standard CMOS Technology For ACS/Herschel," Proceedings Of SPIE, pp. 622-629, vol. 5498.

Nagata, H. et al., "Cryogenic Capacitive Transimpedance Amplifier For Astronomical Infrared Detectors," IEEE Transactions On Electron Devices, Feb. 2004, pp. 270-278, vol. 51, No. 2.

Rabanus, D. et al., "Design And Assembly Of A Stressed Ge:Ga Photoconductor Array For AIRES," Proc. Of SPIE, Apr. 2000, pp. 145-152, vol. 4014.

Walker, C.K. et al., "A Far-Infrared Array Receiver (FAR) For SOFIA," Proc. Of SPIE, Apr. 2000, pp. 122-133, vol. 4014.

Watanabe, K. et al., "Development Of GaAs Photoconductors For Far-Infrared/Submillimleter Astronomy," Proceedings Of SPIE, 2004, pp. 637-646, vol. 5498.

Wolf, J. et al, ed., "Proc. Far-IR, Sub-mm & MM Detector Technology Workshop," Apr. 1-3, 2002, 448 pages.

Young, E. et al., "Detector Needs For Long Wavelength Astrophysics," Jun. 2002, 50 pages.

Young, E.T. et al., "Far-Infrared Imaging Array For SIRTF," SPIE, Mar. 1998, pp. 57-65, vol. 3354.

* cited by examiner

FAR INFRARED PHOTOCONDUCTOR ARRAY

CROSS-REFERENCE TO RELATED APPLICATIONS

This application claims the benefit of U.S. Provisional Application No. 60/546,700, filed Feb. 20, 2004, which is incorporated by reference herein in its entirety.

BACKGROUND OF THE INVENTION

1. Field of Invention

This invention pertains, in general, to sensing far-infrared radiation, and in particular, to a photoconductor array for sensing radiation in the far infrared region of the electromagnetic spectrum.

2. Description of the Background Art

In general, sensing devices are designed to detect radiant energy found in certain regions of the electromagnetic spectrum. Development of a sensing device that detects all wavelengths of radiation from the electromagnetic spectrum can be quite daunting due to the size and complexity of such a device. Therefore, sensing device manufactures have produced devices that are sensitive to certain discrete regions of radiant energy, including far ultraviolet, near ultraviolet, visible, near infrared, and far infrared, within the electromagnetic spectrum. Manufacturing of sensing devices for each of these regions varies depending on the energy of light that is contained within each region. In some cases, like the detection of far infrared light, a sensor includes a one-dimensional line of light sensitive pixels or a two dimensional array of pixels comprised of stacked bars of light sensitive material. Once the incoming light has been detected, readout electronics process electric signals generated by the incident radiation interacting with the detecting material. The challenge of efficiently transferring information (in the form of electronic signals) from the detecting medium to the readout medium has confounded sensing device manufacturers for decades.

For conventional, far-infrared sensing devices, the interface between the detecting array and readout electronics is carried out by wire bonds connecting each detection pixel to the corresponding unit cell within the readout electronics. The wire bonds can be manufactured from an electrically conducting material like copper. However, the extreme size of the detecting and readout media, and, subsequently, the large number of pixels and unit cells to be connected, render wire bonding an inefficient means for interfacing the detecting array with the readout electronics.

Several other challenges also plague the far infrared sensing device community, including the inherent temperature increase of the sensing media, the inherent radiant glow from the readout multiplexer, and a possible thermal mismatch between the sensing material and the readout material. For near infrared sensing devices, an increase in detector temperature and a radiant glow from the readout medium is of little concern due to the high energy of the incoming radiation to be detected and the detectors operating temperature. Any incoming near infrared signal is significantly greater than the background signal generated by detector temperature and readout glow.

However, for far infrared detection, where incoming radiation is substantially less energetic than near infrared radiation and the detectors need to operate in much lower temperatures, readout glow and detector heating become problematic. Any stray light reaching the detecting surface due to glow from the readout multiplexer will compromise detector performance. In addition, the heat generated by the readout affects the performance of the detector array by raising its temperature.

This, in turn, causes an increase in excess dark current, thus resulting in the degradation of detector performance. Also, the effects of readout glow are especially pronounced in the low temperature environment necessary for far infrared detection.

In the case that the detecting media and readout media are constructed from different materials, a thermal mismatch is created. The detecting and readout materials contract and/or expand at different rates when exposed to the low temperatures required for far infrared sensing. When this happens, the overall yield of a detecting device can be significantly decreased.

Another difficulty that arises when detecting radiant energy of any particular wavelength relates to the presence of optical crosstalk between adjacent pixels on the surface of a detecting array. For a conventional detector array, typically a single wafer of some thickness is pixelized on one surface of the array by depositing metallic pads in a desired pattern. These metalized pads are the connections to the readout inputs. In the conventional design of linear arrays made of single bars of detector material, the pixelization is commonly accomplished by cutting grooves into the bar mainly in an effort to eliminate optical crosstalk. However, this approach to eliminating optical crosstalk is not conducive for implementation on large surface area arrays, like those needed for far infrared detection, due to the increase in processing costs for cutting grooves over such a large area.

Furthermore, another significant challenge facing far infrared sensor manufacturers involves maintaining a stable operating voltage for the detecting media during the time that the detecting media waits for its signal to be integrated by the readout media. When the overall voltage (or bias) of the detecting media becomes unstable, or debiased, a significant limitation in detector efficiency is encountered.

What is needed is a sensing device that will efficiently detect far infrared radiation that does not suffer from deficiencies introduced by a) detector heating b), readout glow, c) thermal mismatching, d) detector debiasing, and e) optical crosstalk.

SUMMARY OF THE INVENTION

A hybrid photoconductor array enables the detection of far infrared radiation without significant interference from the problems described above. An embodiment of the photoconductor array places a blocking layer in between the detecting layer and the readout layer, significantly reducing signal contamination generated by detector heating and readout glow. The blocking layer advantageously provides an electrical connection between the detecting layer and the readout layer. An embodiment provides the blocking layer with conductive vias for directing electrical signals from the detecting layer to the readout layer.

DETAILED DESCRIPTION OF THE INVENTION

Figure 1:
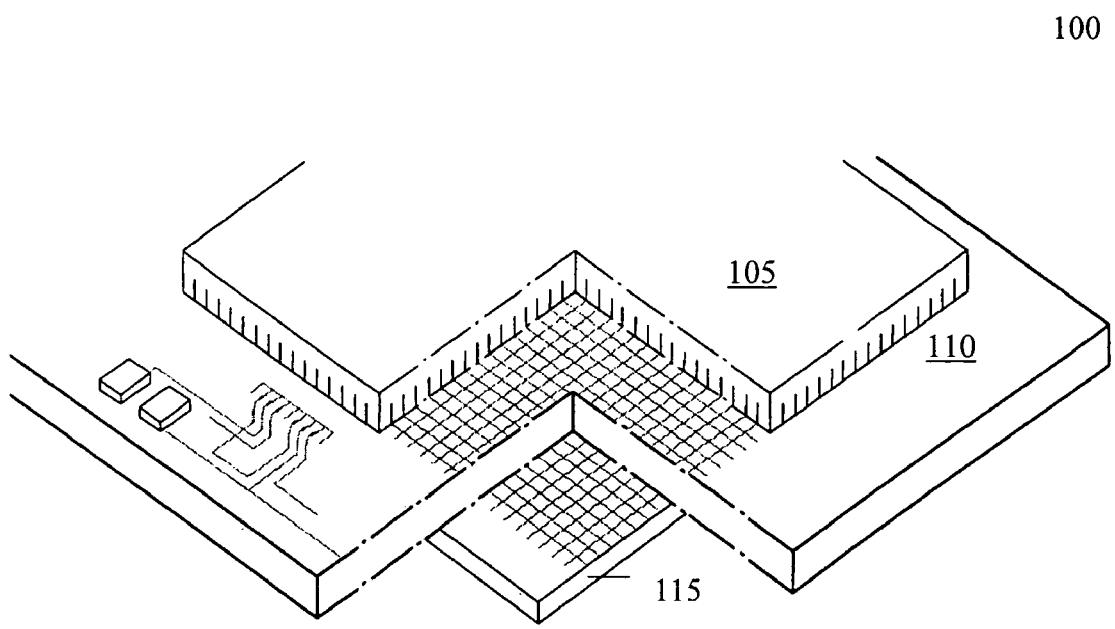
FIG. 1 is diagram of a far infrared detector in accordance with an embodiment of the present invention.

FIG. 1 illustrates a far infrared (IR) photoconductor array 100, according to one embodiment of the present invention. Photoconductor array 100 is designed such that a blocking layer 110 is sandwiched between a detecting layer 105 and a readout layer 115. The design of photoconductor array 100 provides superior protection against readout glow by having the blocking layer 110 restrict the glow from reaching the detecting layer 105.

Detecting layer 105 converts radiant energy, particularly far infrared radiation, into electrical signals containing information about the incoming radiation that are processed by readout layer 115 and subsequently analyzed by a computer-based micro-processing device. In addition to blocking the glow from the readout layer 115 from reaching detecting layer 105, the blocking layer 110 provides an effective electrical conduit between detecting layer 105 and readout layer 115 for transferring electrical signals. Readout layer 115 specifically converts electrical current (or photocurrent) from the detecting layer 105 into a usable voltage that can be processed as needed.

A wide range of materials are available for construction of detecting layer 105, including GaAs, InAs, InSb, Ge:Ga, CdTe, Ge:Sb, and HgTe. GaAs offers the potential of extending the long wavelength response of detecting layer 105 to 300 μm, which is advantageous for sensing a variety of phenomena that emit radiation in the far infrared. InAs and InSb have the added capability of extending the long wavelength response of detecting layer 105 even further, to 886 μm and 1771 μm respectively.

In an embodiment, the blocking layer 110 is constructed from alumina ($Al_2O_3$). Alumina, as a material, is partially opaque in the far IR and sub-millimeter region and can further be formulated in manufacturing to provide a superior optical block. In another embodiment, blocking layer 110 is constructed from any particular thermally conductive, electrically insulating material that is generally opaque to radiation from the far infrared region of the electromagnetic spectrum. Opaque materials, like alumina, absorb radiation within the far IR, thus significantly reducing effects of readout glow.

An embodiment of readout layer 115, is a capacitive transimpedance amplifier (CTIA). CTIA readouts employ an integration-reset scheme to convert the detecting layer 105 photocurrent to a voltage that can subsequently be processed as needed. In one embodiment, the front end of the CTIA is a high gain amplifier, typically a pair of p-type MOSFETs in the cascade configuration, with a capacitor in the feedback loop. To achieve high open-loop gain, one embodiment uses a pair of n-type MOSFETs, also in the cascade configuration, as a load for this amplifier. CMOS technology allows fabrication of both p-type and n-type MOSFETs on the same chip, which provide amplifiers with high open-loop gains and superior performance for integrating low-level signals. A multi-gain circuit provides operation under a broad range of infrared flux levels. This can be accomplished by using multiple feedback capacitors enabled as needed to provide different well capacities and, therefore, different gain settings. During the integration time, when the reset switches are open, the photocurrent from the detecting layer 105 accumulates as an integrated charge on the feedback capacitor. By virtue of the negative feedback, the capacitor also pins the detecting layer 105 input node to a constant voltage, thereby keeping the bias of detecting layer 105 constant, regardless of the integrated signal.

Figure 2:
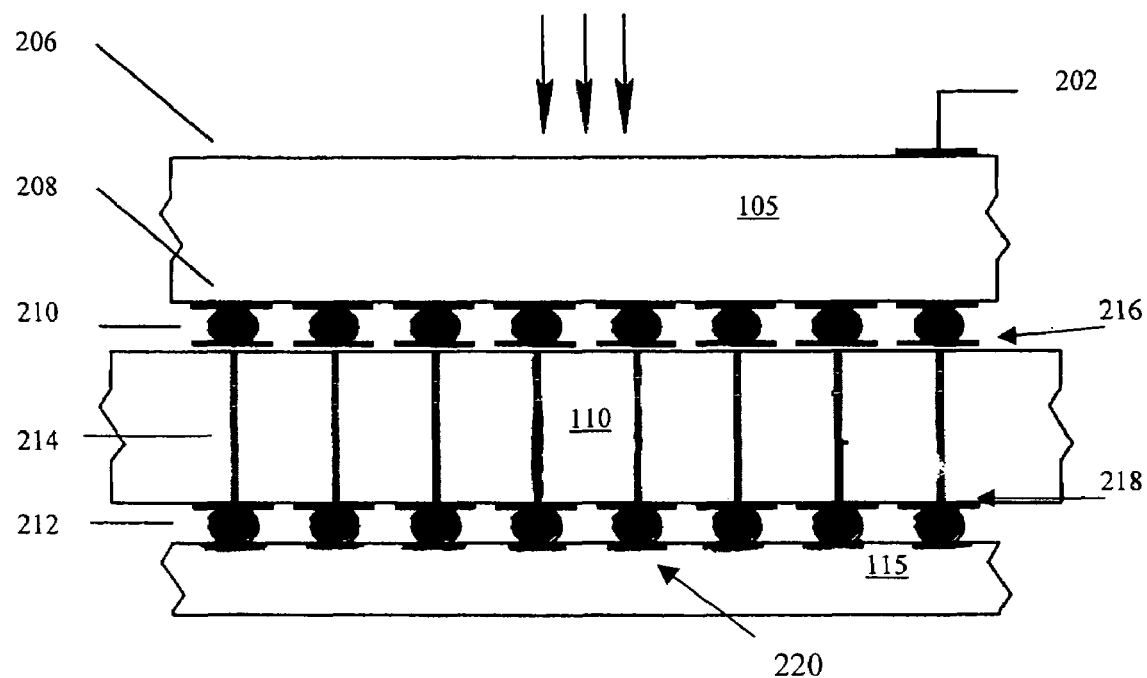
FIG. 2 is a detailed view of a far infrared detector in accordance with an embodiment of the present invention.

FIG. 2 is a cutaway view showing an embodiment of photoconductor array 100, according to an embodiment of the present invention, where far infrared (IR) radiation 204 is incident upon a top surface 206 of the detecting layer 105. The top surface 206, opposite to an array of detection pads 208, serves as a transparent contact that receives the incident far IR radiation 204 and also serves as a common bias pad 202. The array of detection pads 208 is positioned on the bottom surface of the detecting layer 105 and serves as a contact point for transmitting the photocurrent generated by detecting layer 105 to readout layer 115. Due to reflection of the far infrared radiation 204 at the detection pads 208, the effective optical depth of the detecting array is, in essence, twice the thickness of the detecting layer 105.

In an embodiment, the array of detection pads 208 is ion implanted on the bottom surface of the detecting layer 105 through a shadowmasking process in order to create a pixelised array. Through the shadowmasking process, an area of high electrical conductivity is defined by depositing an inverted mask where an electrical contact is to be made. Utilizing a shadowmasking approach in detector design significantly simplifies the array construction, especially for the large format arrays. In an embodiment, detection pads are constructed from gold, aluminum, copper, or any particular conducting material, to provide sufficient electrical conductivity between the detecting layer 105 and the blocking layer 110.

In an embodiment, the blocking layer 110 is provided with a first array of conductive pads 216 on the top surface of the blocking layer 110 and a second array of conductive pads 218 on the bottom surface of the blocking layer 100. The first array of conductive pads 216 is aligned with the array of detection pads 208 and the second array of conductive pads 218 is aligned with an array of readout pads 220 on a top surface of the readout layer 115. In an embodiment, readout pads are constructed from gold, aluminum, copper, or any particular conducting material.

In order to provide a more efficient processing of far infrared signals between the detecting layer 105 and the readout layer 115, in one embodiment, a first 210 and second 212 array of bump bonds and an array of conductive vias 214 are manufactured with blocking layer 110, as shown in FIG. 2. The first array of bump bonds 210 also serves as a heat sink into the blocking layer 110 and the array of conductive vias 214, in order to further dissipate heat generated by the detecting layer 105 at the array of detection pads 208. The second array of bump bonds 212 also serves as a heat sink into the blocking layer 110 and the array of conductive vias 214, in order to further dissipate heat generated by the readout layer 115. Furthermore, the conductive vias 214 provide an electrical connection between the first 216 and second 218 array of conductive pads, thus allowing detector photocurrent to pass through the blocking layer, while restricting the amount of readout glow from being transmitted to detecting layer 105. In one embodiment, the array of conductive vias 214 are constructed from aluminum or any particularly conductive material.

In one embodiment, the first 210 and second 212 array of bump bonds are constructed from indium. In another embodiment, the first 210 and second 212 array of bump bonds are constructed from any particular conductive medium, like a conductive epoxy. Bump bonding (as opposed to wire bonding) is a beneficial means for providing an electrical connection between the detecting layer 105 and readout layer 115 because the overall size of the far IR photoconductor array 100 is reduced as compared to conventional detecting arrays.

In an embodiment, the blocking layer 110 is selected based on its thermal conductivity and expansion coefficient in order to: provide proper heat sinking of the detecting layer so that the detecting layer 105 reaches an optimum cryogenic operating temperature; and to dampen the inherent effects of thermal mismatching between the detecting layer 105 and readout layer 115. By selecting blocking layer 110 with an expansion coefficient substantially equal to the expansion coefficient of the detecting layer 105 and readout layer 115, the blocking layer 110 effectively alleviates undue stress on the first 210 and second 212 array of bump bonds that might occur while the detecting layer 105 and readout layer 115 are cooling, and therefore contracting, at different rates. According to an embodiment, the detecting layer 105 is constructed from germanium (Ge) and the readout layer 115 is constructed from silicon (Si). In this case, alumina is an adequate selection for the blocking layer because the expansion coefficient of alumina is in between that of silicon and germanium.

Figure 3:
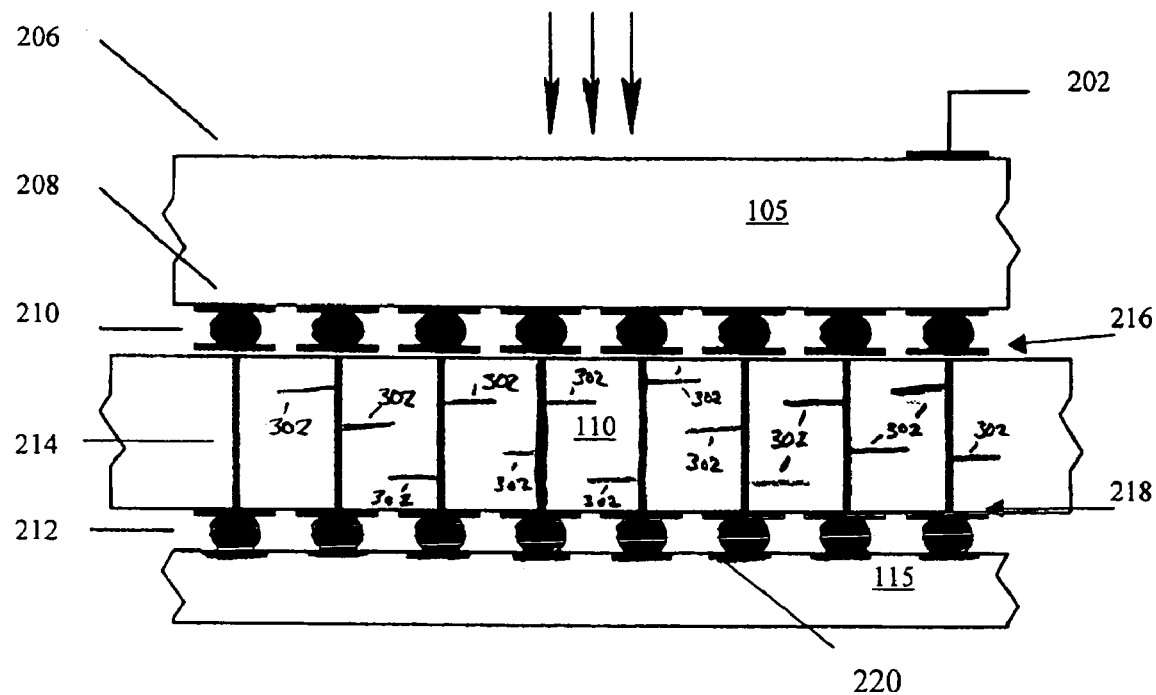
FIG. 3 is a detailed view of a far infrared detector in accordance with another embodiment of the present invention.

According to an embodiment of the present invention, a blocking pad is imbedded within the blocking layer 110, substantially near the array of conductive vias 214, in order to further reduce transmission of background radiation due to readout glow. According to an embodiment, the blocking pad is constructed from a conducting materials such as aluminum, copper, or gold. According to another embodiment, a plurality of blocking pads 302, as shown in FIG. 3, are positioned such that any stray radiation from the readout layer is forced to travel through a meandering path, and thus further reducing the effects of readout glow on the detecting layer. Blocking pads 302 are arranged substantially parallel to the first 216 and second 218 array of conductive pads and extend substantially beyond one end of a conductive pad from the first array of conductive pads 216 and a conductive pad from the second array of conductive pads 218.

In order to effectively transfer electrical signals from the detecting layer 105, through the blocking layer 110, to the readout layer 115, the array of readout pads 220, is positioned on the top surface of the readout layer 115, and aligned with the array of detection pads 208. The array of readout pads 220 serves as a contact point for receiving photocurrent from detecting layer 105 and transforming the photocurrent into a usable voltage by readout layer 115. Proper alignment of the conductive arrays with the corresponding detection pads is important for maintaining an effective electrical connection between the detecting layer 105 and the readout layer 115. Also, precise alignment of these elements insures that electrical signals received by the readout layer 115 are limited only to those produced by the detecting layer 105 and not by an outside source. Furthermore, selecting the blocking layer 110 such that the thermal conductivity of the blocking layer is adequately high allows for adequate heat sinking of the detecting layer 105 during cryogenic cooling.

While the invention has been particularly shown and described with reference to a preferred embodiment and various alternate embodiments, it will be understood by persons skilled in the relevant art that various changes in form and details can be made therein without departing from the spirit and scope of the invention.

The invention claimed is:

1. An apparatus for detecting far infrared radiation comprising:
a detecting layer, formed on a first substrate, for receiving far infrared radiation and converting the radiation into a first electrical signal;
a readout layer, formed on a second substrate, for receiving the first electrical signal, converting the first electrical signal to a second electrical signal suitable for processing by a micro-processing device, and generating background radiation capable of detrimentally affecting an efficiency of the detecting layer; and
a blocking layer, formed by a third substrate situated in between the first substrate and the second substrate, for transmitting the first electrical signal from the detecting layer to the readout layer, providing a heat sink for both the detecting layer and the readout layer, and blocking the background radiation of the readout layer from reaching the detecting layer, and wherein the third substrate is constructed from a material that is opaque to far infrared radiation.

2. The apparatus of claim 1, wherein the blocking layer further comprises:
a first array of conductive pads on a top surface of the third substrate and a second array of conductive pads on the bottom surface of the third substrate; and
an array of conductive vias passing through the third substrate, in electrical contact with the first and second array of conductive pads, and substantially aligned with the first and second array of conductive pads.

3. The apparatus of claim 1, wherein the third substrate is constructed from an electrically insulating material.

4. The apparatus of claim 1, wherein the third substrate is constructed from a material that is opaque to far infrared radiation.

5. The apparatus of claim 1, wherein the third substrate is constructed from a thermally conductive material.

6. The apparatus of claim 2, wherein the blocking layer further comprises:
one or more blocking pads imbedded within the third substrate, aligned substantially perpendicular to a long axis of the array of conductive vias, for blocking the background radiation of the readout layer from reaching the detecting layer.

7. The apparatus of claim 6, wherein the one or more blocking pads are staggered throughout the third substrate, forcing the background radiation to travel in a meandering path.

8. The apparatus of claim 2 further comprising:
a first array of bump bonds providing electrical connection between the first array of conductive pads and an array of detection pads, the array of detection pads located on a bottom surface of the detecting layer; and
a second array of bump bonds providing electrical connection between the second array of conductive pads and an array of readout pads, the array of readout pads located on a top surface of the readout layer.

9. The apparatus of claim 8, wherein the first and second array of bump bonds are constructed from a conductive epoxy or indium.

10. An apparatus for detecting far infrared radiation comprising:
a receiving means, formed on a first substrate, for receiving a far infrared signal, the receiving means capable of converting the far infrared signal into a first electrical signal;
a reading means, formed on a second substrate, for reading the first electrical signal, the reading means capable of converting the first electrical signal into a second electrical signal suitable for electronics processing; and
a transmitting means, formed by a third substrate, for transmitting the first electrical signal to the reading means, the transmitting means capable of shielding the detecting means from receiving background radiation emitted from the reading means, and wherein the third substrate is constructed from a material that is opaque to far infrared radiation.

11. The apparatus of claim 10, wherein the third substrate is constructed from an electrically insulating material with a top and a bottom surface.

12. The apparatus of claim 10, wherein the first substrate is constructed from a material, having a first thermal expansion coefficient, and a top and a bottom surface.

13. The apparatus of claim 12, wherein the second substrate is constructed from a material, having a second thermal expansion coefficient, and a top and a bottom surface.

14. The apparatus of claim 13, wherein the third substrate is constructed from a material, having a third thermal expansion coefficient, and a top and a bottom surface.

15. The apparatus of claim 14, wherein the third thermal expansion coefficient is a value in between the first and second thermal expansion coefficients.

16. The apparatus of claim 13, wherein the transmitting means further comprises:
a conducting means, passing through the third substrate, for conducting electrical signals from the bottom surface of the receiving means to the top surface of the reading means.

17. The apparatus of claim 16, wherein the transmitting means further comprises a blocking means, embedded within the third substrate, substantially near the conducting means, for shielding the receiving means from receiving background radiation generated from the reading means.

18. The apparatus of claim 16, wherein the conducting means is an array of conductive vias substantially aligned perpendicular to the bottom surface of the receiving means and the top surface of the reading means.

19. A method for manufacturing a sensor for sensing far infrared radiation, the method comprising the steps of:
establishing a support substrate, with a top and a bottom surface, for transmitting electrical signals and blocking background radiation, and wherein the support substrate is constructed from a material that is opaque to far infrared radiation;
depositing a second substrate on the top surface of the support substrate for receiving far infrared radiation and converting the received far infrared radiation into a first electrical signal; and
depositing a third substrate on the bottom surface of the support substrate for receiving the first electrical signal and converting the first electrical signal to a second electrical signal suitable for processing by a microprocessing device.

20. The method of claim 19, wherein the support substrate prevents background radiation generated by the second layer from reaching the first layer.

21. The method of claim 19, wherein the support substrate transmits the first electrical signal from the first layer to the second layer.

22. The method of claim 19, further comprising:
boring an array of conductive vias through the support substrate, such that the array of conductive vias is in electrical contact with the first and second layers and substantially aligned perpendicular with the first and second layers.

23. The method of claim 22, further comprising:
imbedding a plurality of conductive pads within the support substrate, substantially perpendicular to the array of conductive vias, such that the background radiation generated by the second layer is forced to proceed through a meandering path when traveling towards the first layer.

24. The method of claim 19, wherein the third substrate comprises a capacitive transimpedance amplifier.

25. The apparatus of claim 8, wherein the first array of bump bonds is constructed from a conductive epoxy and the second array of bump bonds is constructed from indium.

26. An apparatus for detecting far infrared radiation comprising:
a detecting layer, formed on a first substrate, for receiving far infrared radiation and converting the radiation into a first electrical signal;
a readout layer, formed on a second substrate, for receiving the first electrical signal, converting the first electrical signal to a second electrical signal suitable for processing by a micro-processing device, and generating background radiation capable of detrimentally affecting an efficiency of the detecting layer; and
a blocking layer, formed by a third substrate situated in between the first substrate and the second substrate, for transmitting the first electrical signal from the detecting layer to the readout layer, providing a heat sink for both the detecting layer and the readout layer, and blocking the background radiation of the readout layer from reaching the detecting layer, and wherein the third substrate comprises one or more embedded blocking pads positioned to cut off a linear path for the background radiation of the readout layer to reach the detecting layer.

27. An apparatus for detecting far infrared radiation comprising:
a receiving means, formed on a first substrate, for receiving a far infrared signal, the receiving means capable of converting the far infrared signal into a first electrical signal;
a reading means, formed on a second substrate, for reading the first electrical signal, the reading means capable of converting the first electrical signal into a second electrical signal suitable for electronics processing; and
a transmitting means, formed by a third substrate, for transmitting the first electrical signal to the reading means, the transmitting means capable of cutting off a linear path for background radiation emitted from the reading means to reach the receiving means.

28. A method for manufacturing a sensor for sensing far infrared radiation, the method comprising the steps of:
establishing a support substrate, with a top and a bottom surface, for transmitting electrical signals and blocking background radiation;
depositing a second substrate on the top surface of the support substrate for receiving far infrared radiation and converting the received far infrared radiation into a first electrical signal; and
depositing a third substrate on the bottom surface of the support substrate for receiving the first electrical signal and converting the first electrical signal to a second electrical signal suitable for processing by a microprocessing device, and
wherein the support substrate comprises one or more embedded blocking pads positioned to cut off a linear path for background radiation emitted from the third substrate to reach the second substrate.

* * * * *